(12) United States Patent
Hwang et al.

(10) Patent No.: US 11,769,855 B2
(45) Date of Patent: Sep. 26, 2023

(54) MICRO LIGHT EMITTING DEVICE AND DISPLAY APPARATUS HAVING THE SAME

(71) Applicant: SAMSUNG ELECTRONICS CO., LTD., Suwon-si (KR)

(72) Inventors: Kyungwook Hwang, Seoul (KR); Junsik Hwang, Hwaseong-si (KR); Seogwoo Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 195 days.

(21) Appl. No.: 17/194,942

(22) Filed: Mar. 8, 2021

(65) Prior Publication Data

US 2022/0077346 A1 Mar. 10, 2022

(30) Foreign Application Priority Data

Sep. 8, 2020 (KR) .................. 10-2020-0114854

(51) Int. Cl.
| | |
|---|---|
| *H01L 33/04* | (2010.01) |
| *H01L 25/075* | (2006.01) |
| *H01L 33/32* | (2010.01) |
| *H01L 33/62* | (2010.01) |
| *H01L 33/14* | (2010.01) |
| *H01L 33/16* | (2010.01) |

(Continued)

(52) U.S. Cl.
CPC .......... *H01L 33/04* (2013.01); *H01L 25/0753* (2013.01); *H01L 33/12* (2013.01); *H01L 33/14* (2013.01); *H01L 33/16* (2013.01); *H01L 33/32* (2013.01); *H01L 33/62* (2013.01); *H01L 33/50* (2013.01)

(58) Field of Classification Search
CPC ......... H01L 33/14; H01L 33/12; H01L 33/16; H01L 33/04; H01L 33/32; H01L 33/62
See application file for complete search history.

(56) References Cited

U.S. PATENT DOCUMENTS 5,130,843 A * 7/1992 He ........................... G02F 1/11
359/305
5,917,196 A * 6/1999 Teraguchi ............... H01L 33/32
257/94

(Continued)

FOREIGN PATENT DOCUMENTS

| EP | 3 836 234 A1 | 6/2021 |
| GB | 2 280 061 A | 1/1995 |

(Continued)

OTHER PUBLICATIONS https://en.wikipedia.org/wiki/Superlattice#:~:text=A%20superlattice%20is%20a%20periodic,quantum%20dots%20or%20quantum%20wells. (Year: 2022).*

(Continued)

*Primary Examiner* — Feifei Yeung Lopez
(74) *Attorney, Agent, or Firm* — Sughrue Mion, PLLC

(57) ABSTRACT

Provided is a micro light emitting device and a display apparatus having the micro light emitting device. The micro light emitting device includes a first-type semiconductor layer provided on a substrate, a superlattice layer provided on the first-type semiconductor layer, a current blocking layer provided on a side portion of the superlattice layer, an active layer provided on the superlattice layer and the current blocking layer, and a second-type semiconductor layer provided on the active layer.

28 Claims, 14 Drawing Sheets

(51) Int. Cl.
   *H01L 33/12* (2010.01)
   *H01L 33/50* (2010.01)

(56) References Cited

U.S. PATENT DOCUMENTS

| | | | |
|---|---|---|---|
| 6,597,716 B1* | 7/2003 | Takatani | B82Y 20/00 |
| | | | 372/46.01 |
| 10,158,043 B2 | 12/2018 | Chen et al. | |
| 10,862,010 B2 | 12/2020 | Bonar et al. | |
| 2003/0047744 A1* | 3/2003 | Yanamoto | B82Y 20/00 |
| | | | 257/98 |
| 2005/0199891 A1* | 9/2005 | Kunisato | H01L 33/20 |
| | | | 257/85 |
| 2006/0151793 A1* | 7/2006 | Nagai | H01L 27/156 |
| | | | 257/E25.02 |
| 2010/0051986 A1* | 3/2010 | Min | H01L 33/18 |
| | | | 977/932 |
| 2013/0248911 A1 | 9/2013 | Hwang et al. | |
| 2016/0336484 A1 | 11/2016 | McGroddy et al. | |
| 2017/0047481 A1 | 2/2017 | Bonar et al. | |
| 2017/0179340 A1 | 6/2017 | Chen et al. | |
| 2017/0237234 A1* | 8/2017 | Han | H01S 5/18361 |
| | | | 372/45.012 |
| 2018/0190870 A1 | 7/2018 | Sung et al. | |

FOREIGN PATENT DOCUMENTS

| | | |
|---|---|---|
| JP | 2009-188249 A | 8/2009 |
| JP | 2016-219780 A | 12/2016 |
| KR | 10-0275774 B1 | 1/2001 |
| KR | 10-2017-0084139 A | 7/2017 |
| KR | 10-1817798 B1 | 2/2018 |
| WO | 2020/029657 A1 | 2/2020 |

OTHER PUBLICATIONS

Olivier et al., "Influence of size-reduction on the performances of GaN-based micro-LEDs for display application," Elsevier, Journal of Luminescence, vol. 191, Nov. 2017, pp. 112-116.

Communication dated Jan. 7, 2022, issued by the European Patent Office in European Application No. 21184076.4.

Vincent W. Lee et al., "Micro-LED Technologies and Applications", Information Display, Nov. 2016, vol. 32, Issue No. 6, pp. 16-23.

* cited by examiner

MICRO LIGHT EMITTING DEVICE AND DISPLAY APPARATUS HAVING THE SAME

CROSS-REFERENCE TO RELATED APPLICATION

This application is based on and claims priority under 35 U.S.C. § 119 to Korean Patent Application No. 10-2020-0114854, filed on Sep. 8, 2020, in the Korean Intellectual Property Office, the disclosure of which is incorporated by reference herein in its entirety.

BACKGROUND

1. Field

Example embodiments of the disclosure relate to a micro light emitting device having an improved emission efficiency and a display apparatus having the micro light emitting device.

2. Description of the Related Art

Liquid crystal displays (LCDs), organic light emitting diode (OLED) displays, and the like are widely used in display apparatuses. Recently, a technology to manufacture a high-resolution display apparatus by using a micro-sized micro light emitting diode (LED) has been utilized.

With regard to micro LEDs, as the size of a chip decreases, the emission efficiency deteriorates. This phenomenon is due to a sidewall etching damage which occurs when a micro LED sized chip is manufactured. The sidewall etching damage induces non-emission combination that prevents an electron-hole pair from normally bonding to each other.

SUMMARY

One or more example embodiments provide a micro light emitting device with improved emission efficiency.

One or more example embodiments also provide a display apparatus including a micro light emitting device with improved emission efficiency.

Additional aspects will be set forth in part in the description which follows and, in part, will be apparent from the description, or may be learned by practice of the example embodiments of the disclosure.

In accordance with an aspect of an example embodiment, there is provided a micro light emitting device including: a substrate; a first-type semiconductor layer provided on the substrate; a superlattice layer provided on the first-type semiconductor layer; a current blocking layer provided at a side portion of the superlattice layer; an active layer provided on the superlattice layer; and a second-type semiconductor layer provided on the active layer and the current blocking layer.

The current blocking layer may include a porous layer or an air layer.

The porous layer may include a gallium nitride.

The current blocking layer may include: a porous layer that contacts the side portion of the superlattice layer; and an air layer provided on a side portion of the porous layer.

The current blocking layer may extend from the side portion of the superlattice layer to a side portion of the first-type semiconductor layer or a bottom of the first-type semiconductor layer.

The current blocking layer may extend from the side portion of the superlattice layer to a side portion of the active layer.

The micro light emitting device may further include a nano rod type micro light emitting device.

The current blocking layer may be provided extending from the side portion of the superlattice layer to a side portion of the first type semiconductor layer or a bottom of the first type semiconductor layer.

The micro light emitting device may further include a protection layer provided on a side wall of the active layer, a side wall of the second-type semiconductor layer, and an exposed surface of the current blocking layer.

The micro light emitting device may further include a via hole that extends through the second-type semiconductor layer, the active layer and the current blocking layer and into the first-type semiconductor layer.

The current blocking layer may be further provided along a circumference of the via hole of the first-type semiconductor layer.

The micro light emitting device may have as a diameter of about 200 μm or less.

The superlattice layer may include InGaN layers and GaN layers that are alternately stacked.

In accordance with an aspect of an example embodiment, there is provided a display apparatus including: a driving circuit substrate; and a plurality of micro light emitting devices arranged to be electrically connected to the driving circuit substrate, wherein each of the plurality of micro light emitting devices includes: a first-type semiconductor layer, a superlattice layer provided on the first-type semiconductor layer, a current blocking layer provided on a side portion of the superlattice layer, an active layer provided on the superlattice layer and the current blocking layer, and a second-type semiconductor layer provided on the active layer.

The current blocking layer may include a porous layer or an air layer.

The porous layer may include a gallium nitride.

The current blocking layer may include: a porous layer that contacts the side portion of the superlattice layer; and an air layer provided on a side portion of the porous layer.

The current blocking layer may extend from the side portion of the superlattice layer to a side portion of the first-type semiconductor layer or a bottom of the first-type semiconductor layer.

The current blocking layer may extend from the side portion of the superlattice layer to a side portion of the active layer.

The current blocking layer may extend from the side portion of the superlattice layer to a side portion of the first-type semiconductor layer or a bottom of the first-type semiconductor layer.

The display apparatus may further include a protection layer on a side wall of the active layer, a sidewall of the second-type semiconductor layer, and an exposed surface of the current blocking layer.

The display apparatus may further include a via hole penetrating from the second-type semiconductor layer to the first-type semiconductor layer, wherein the current blocking layer is provided around the via hole of the superlattice layer.

Each micro light emitting device of the plurality of micro light emitting devices may have a diameter of about 200 μm or less.

The superlattice layer may include InGaN layers and GaN layers that are alternately stacked.

The display apparatus may further include a color conversion layer configured to change a color of light emitted from the plurality of micro light emitting devices.

The display apparatus may be applied to a micro LED TV, a digital signage, a mobile display apparatus, a wearable display apparatus, a virtual reality apparatus, or an augmented reality apparatus.

In accordance with an aspect of an example embodiment, there is provided a micro light emitting device including: a substrate; a first semiconductor layer provided on the substrate; a superlattice layer provided on the first semiconductor layer; a high resistance layer surrounding at least a portion of a peripheral region the superlattice layer; an active layer provided on the superlattice layer; and a second semiconductor layer provided on the active layer, wherein the high resistance layer has a higher resistance than the superlattice layer.

In accordance with an aspect of an example embodiment, there is provided a micro light emitting device including: a substrate; a first semiconductor layer provided on the substrate; a superlattice layer provided on a first portion of a first surface of the first semiconductor layer; a high resistance layer provided on a second portion of the first surface of the first semiconductor layer; an active layer provided on the superlattice layer; and a second semiconductor layer provided on the active layer, wherein the high resistance layer has a higher resistance than the superlattice layer.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
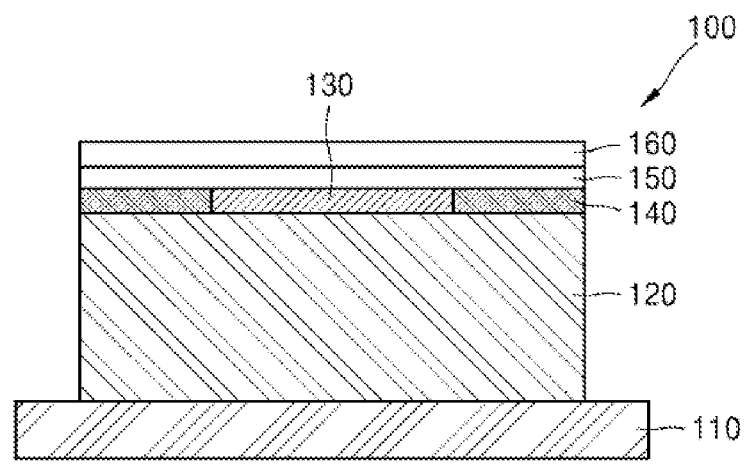
FIG. 1 is a schematic cross-sectional view of a micro light emitting device according to an example embodiment.

Example embodiments will now be described with reference to the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro light emitting device according to various example embodiments and a display apparatus having the same are described in detail with reference to the accompanying drawings. Throughout the drawings, like reference numerals denote like elements, and the size of each constituent element may be exaggerated for convenience of explanation and clarity. While such terms as "first," "second," etc., may be used to describe various components, such components must not be limited to the above terms. The above terms are used only to distinguish one component from another.

The expression of singularity in the specification includes the expression of plurality unless clearly specified otherwise in context. Terms such as "include" or "comprise" may not be construed to necessarily include any and all constituent elements or steps described in the specification, but may be construed to exclude some of the constituent elements or steps or further include additional constituent elements or steps. Furthermore, the thickness or size of each constituent elements illustrated in the drawings may be exaggerated for convenience of explanation and clarity. Furthermore, it will be understood that when a component, such as a material layer, a film, a region, or a plate, is referred to as being "on" another component, the component can be directly on the other component or intervening components may be present thereon. Since a material forming each layer in the following embodiments is exemplary, other materials may be used therefor.

Furthermore, terms such as "~portion," "~unit," "~module," and "~block" stated in the specification may signify a unit to process at least one function or operation and the unit may be embodied by hardware, software, or a combination of hardware and software.

The particular implementations shown and described herein are illustrative examples of the disclosure and are not intended to otherwise limit the scope of the disclosure in any way. For the sake of brevity, conventional or related art electronics, control systems, software development and other functional aspects of the systems may not be described in detail. Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of the terms "a" and "an" and "the" and similar referents in the context of describing the disclosure are to be construed to cover both the singular and the plural.

Also, the steps of all methods described herein can be performed in any suitable order unless otherwise indicated herein or otherwise clearly contradicted by context. Furthermore, the use of any and all examples, or language (e.g., "such as") provided herein, is intended merely to better illuminate the disclosure and does not pose a limitation on the scope of the disclosure unless otherwise claimed.

FIG. 1 is a schematic cross-sectional view of a micro light emitting device 100 according to an example embodiment.

The micro light emitting device 100 may include a substrate 110, a first type semiconductor layer 120 provided on the substrate 110, a superlattice layer 130 provided on the first type semiconductor layer 120, a current blocking layer 140 provided on side portions of the superlattice layer 130, an active layer 150 provided on the superlattice layer 130 and the current blocking layer 140, and a second-type semiconductor layer 160 provided on the active layer 150.

The substrate 110 may include Si, SiC, sapphire ($Al_2O_3$), ZnO, GaAs, InP, or GaN, but embodiments are not limited thereto.

The first-type semiconductor layer 120 may be, for example, an n-type semiconductor layer. Alternatively, the first-type semiconductor layer 120 may be a p-type semiconductor layer. When the first-type semiconductor layer 120 is a p-type semiconductor layer, the second-type semiconductor layer 160 may be an n-type semiconductor layer, and when the first-type semiconductor layer 120 is an n-type semiconductor layer, the second-type semiconductor layer 160 may be a p-type semiconductor layer.

The first-type semiconductor layer 120 may include a nitride semiconductor layer. The first-type semiconductor layer 120 may include, for example, a GaN layer, an AlN layer, or an $Al_xGa(1-x)N(0 \leq x \leq 1)$ layer. The superlattice layer 130 may include, for example, an InGaN/GaN superlattice layer, an AlN/GaN superlattice layer, or an $Al_xIn_yGa1-x-yN/Al_xIn_yGa1-x-yN(0 \leq x,y \leq 1, x \neq y)$ superlattice layer. The superlattice layer 130 may alleviate current spreading and strain below the active layer 150. The superlattice layer 130 may have a structure in which a first layer and a second layer are alternately stacked, and for example, in an InGaN/GaN superlattice layer, an InGaN layer and a GaN layer may be alternately arranged. The superlattice layer 130 may have a bandgap greater than the active layer 150 to prevent light output from or light absorption by the superlattice layer 130. For example, the active layer 150 may be a stack of ten (10) pairs of an $In_{15}Ga_{75}N$/GaN layer to a 5 nm/5 nm thickness, and the superlattice layer 130 may be a stack of thirty (30) pairs of an $In_5Ga_{95}N$/GaN layer to a 1 nm/1 nm thickness. The superlattice layer 130 may contain an In content less than the active layer 150, and may be configured with a layer thinner than the thickness of the active layer 150.

The current blocking layer 140 may be provided at the side portions of the superlattice layer 130 and may block current flowing from the first-type semiconductor layer 120 to the second-type semiconductor layer 160. The current blocking layer 140 may include, for example, a high resistance layer having relatively higher resistance than the superlattice layer 130. More specifically, the superlattice layer 130 is provided on a first portion of a first surface of the first semiconductor layer, while the current blocking layer 140 is provided on a second portion of the first surface of the first semiconductor layer. The current blocking layer 140 may include, for example, a porous layer. The current blocking layer 140 may include, for example, a porous gallium nitride. As the current blocking layer 140 comprises a high resistance layer, when a current flows from the first-type semiconductor layer 120 to the second-type semiconductor layer 160, the current flows, not toward the current blocking layer 140, but toward the superlattice layer 130 that has relatively lower resistance than the current blocking layer 140. Accordingly, the current may intensively flow in a central area of the active layer 150 through the superlattice layer 130.

The active layer 150 may emit light due to an electron-hole recombination, may include, for example, a nitride semiconductor layer, and may adjust an emission wavelength range by controlling a bandgap energy. The active layer 150 may include a quantum well layer and a barrier layer, for example, a quantum well layer and a barrier layer, which may include InGaN/GaN, InGaN/InGaN, InGaN/AlGaN, or InGaN/InAlGaN. The quantum well layer may include a single quantum well layer or a multi quantum well layer.

The second-type semiconductor layer 160 may include, for example, a GaN layer, an AlN layer, or an $Al_xGa(1-x)N(0 \leq x \leq 1)$ layer. For example, a p-type dopant may include Mg, Ca, Zn, Cd, Hg, and the like.

For example, the micro light emitting device 100 may have a diameter of 200 μm or less. The diameter may indicate the maximum diameter of a cross-section of the micro light emitting device 100. The cross-section may indicate a cross-section perpendicular to a direction in which light is output from the micro light emitting device 100. The micro light emitting device 100 may have various shapes such as a triangular cross-section, a rectangular cross-section, a circular cross-section, and the like.

As the size of the micro light emitting device 100 decreases, emission efficiency may be reduced. The reduction of emission efficiency may be due to non-emission recombination at a sidewall located at an outer edge of an emission device exposed by etching during manufacture of the micro light emitting device 100. Such a non-emission combination is further increased during injection of a current, and thus the etched sidewall may operates as a leakage channel that restricts the injection of a current into the active layer. The influence of the circumference of the sidewall increases as the size of the emission device decreases. Accordingly, a problem that the emission efficiency is much reduced may be generated.

According to an example embodiment, as the current blocking layer 140 is provided at the sidewall of the superlattice layer 130 to control a current flow toward the active layer 150, the current may be concentrated on a damage-free central area. The current blocking layer 140 may be formed by selectively etching the sidewall of the superlattice layer 130. For example, the current blocking layer 140 may include a porous layer. The porous layer may include, for example, a gallium nitride. For example, the current blocking layer 140 that is porous may be formed by etching the side portion of the superlattice layer 130 by using an electrochemical etching method.

As the current blocking layer 140 that is porous has a relatively high resistance compared with the superlattice layer 130, the current flow toward the active layer 150 may be controlled.

Figure 2:
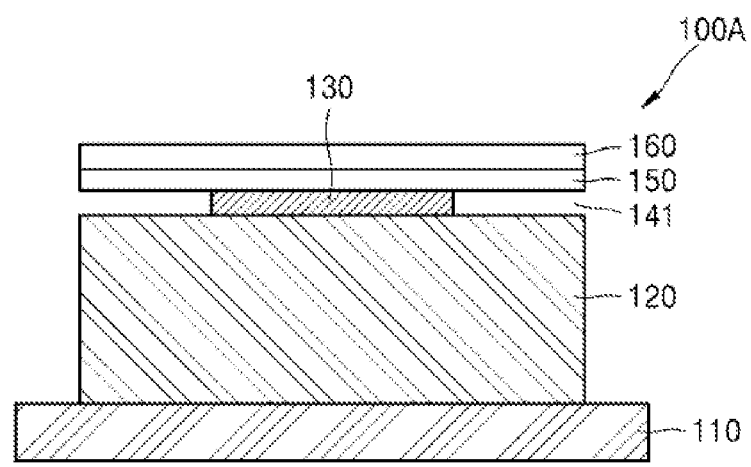
FIG. 2 illustrates a modified micro light emitting device of FIG. 1 according to an example embodiment.

FIG. 2 illustrates a modified example of the micro light emitting device 100 of FIG. 1.

In FIG. 2, as constituent elements having the same reference numerals as those in FIG. 1 are substantially the same constituent elements in FIG. 1, detailed descriptions thereof are omitted.

A micro light emitting device 100A may include a current blocking layer 141 provided at the side portion of the superlattice layer 130. The current blocking layer 141 may include an air layer.

The current blocking layer 141 may be formed by selectively etching the superlattice layer 130 by, for example, an electrochemical etching method or a photochemical etching method.

According to the electrochemical method, etching may be performed by a method of dipping a sample to be etched in a specific solvent and connecting an electrode to the sample and the solvent to generate a carrier by an external bias. In this state, the solvent in use may include various solvents such as oxalic acid, and the like. As the electrochemical etching method, a method of directly connecting an electrode to a sample may be employed, or a method of indirectly connecting an electrode by using two chambers may be employed.

When a voltage is applied to the sample to which the electrode is connected, selective etching may be performed on a GaN/InGaN sample under a specific condition. For example, primarily, the GaN/InGaN layer may be deformed to a porous layer, and the GaN/InGaN layer may be removed over a critical voltage. By selectively applying a voltage, the side portion of the superlattice layer 130 having relatively superior carrier confinement may be etched. A depth to be etched may be adjusted by etching time and voltage. An etchant may include, for example, at least one of KOH, NaOH, HCl, $C_2H_2O_4$, $H_2SO_4$, $HNO_3$, or HF.

Figure 3:
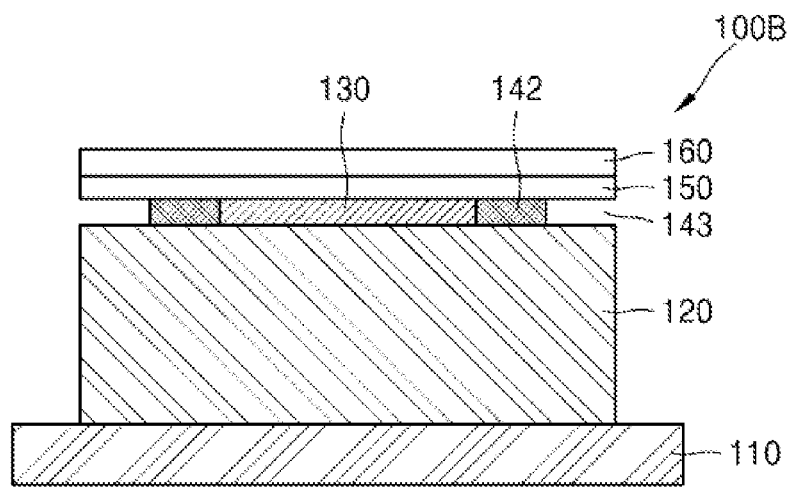
FIG. 3 illustrates another modified micro light emitting device of FIG. 1 according to another example embodiment.

FIG. 3 illustrates another modified example of the micro light emitting device 100 of FIG. 1.

A micro light emitting device 100B may include a porous layer 142 provided to be in contact with the side portion of the superlattice layer 130, and an air layer 143 provided at a side portion of the porous layer 142.

The porous layer 142 and the air layer 143, as described above, may be formed, for example, by selectively etching a GaN layer by an electrochemical method.

As the micro light emitting device 100B according to an embodiment may include a current blocking layer in the side portion of the superlattice layer 130, and a current path below the active layer 150 is concentrated at the center of the micro light emitting device 100B, thereby improving the emission efficiency. The current blocking layer may block a current path in a sidewall damage area of the active layer 150 generated due to etching for dividing the micro light emitting device 100B into units of chips. Accordingly, an electron-hole recombination rate in the active layer 150 may be increased, and the emission efficiency may be improved.

Figure 4:
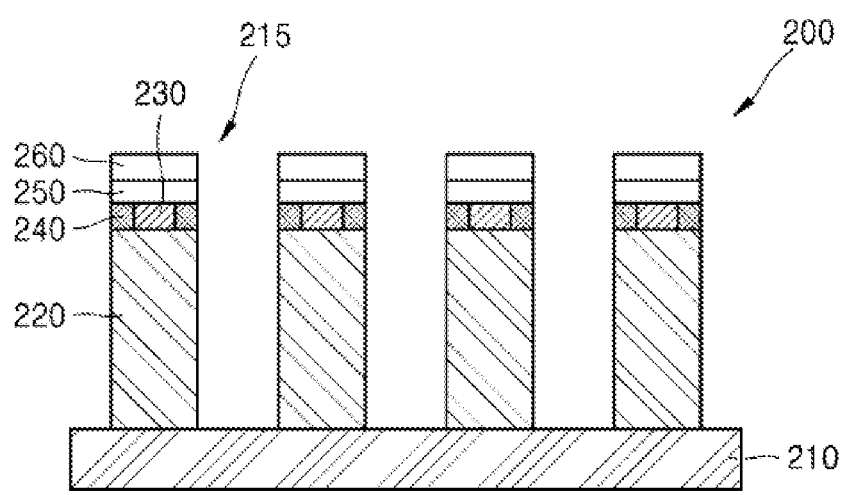
FIG. 4 is a schematic cross-sectional view of a micro light emitting device according to another example embodiment.

FIG. 4 illustrates a micro light emitting device 200 according to another example embodiment.

The micro light emitting device 200 may include a substrate 210, and a plurality of nano rod emission devices 215 that are arranged on the substrate 210 spaced apart from each other. The nano rod emission devices 215 each may include a first-type semiconductor layer 220, a superlattice layer 230 provided on the first-type semiconductor layer 220, a current blocking layer 240 provided at side portions of the superlattice layer 230, an active layer 250 provided on the superlattice layer 230 and the current blocking layer 240, and a second-type semiconductor layer 260 provided on the active layer 250.

The current blocking layer 240 may include a porous layer.

The nano rod emission devices 215 may have, for example, a diameter of 1 µm or less and a height of 5 µm or less. As the constituent elements of FIG. 4 are substantially the same as those described in FIG. 1, detailed descriptions thereof are omitted.

Figure 5:
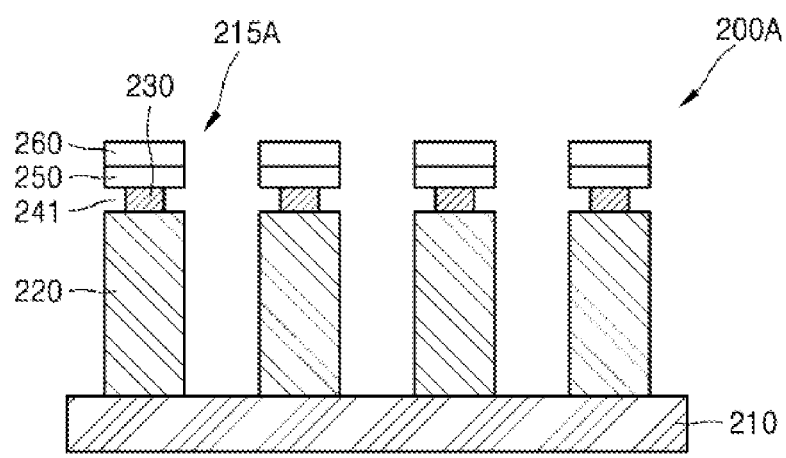
FIG. 5 illustrates a modified example of the micro light emitting device of FIG. 4 according to an example embodiment.

FIG. 5 illustrates a modified example of the micro light emitting device 200 of FIG. 4.

A micro light emitting device 200A may include a plurality of nano rod emission devices 215A, and each of the nano rod emission devices 215A may include a current blocking layer 241. The current blocking layer 241 may include an air layer. The current blocking layer 241 may include between the active layer 250 and the first-type semiconductor layer 220.

Figure 6:
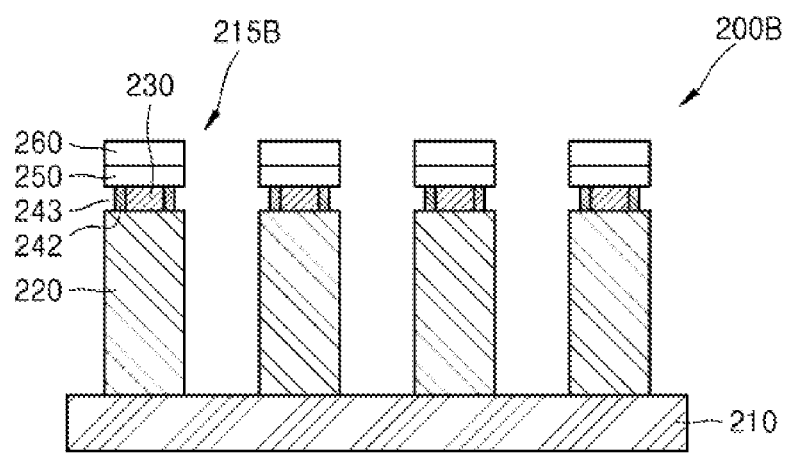
FIG. 6 illustrates another modified example of the micro light emitting device of FIG. 4 according to an example embodiment.

FIG. 6 illustrates another modified example of the micro light emitting device 200 of FIG. 4.

A micro light emitting device 200B may include a plurality of nano rod emission devices 215B. Each of the nano rod emission devices 215B may include a current blocking layer. The current blocking layer may include a porous layer 242 provided in contact with a side portion of a superlattice layer 330, and an air layer 243 provided at a side portion of the porous layer 242.

Figure 7:
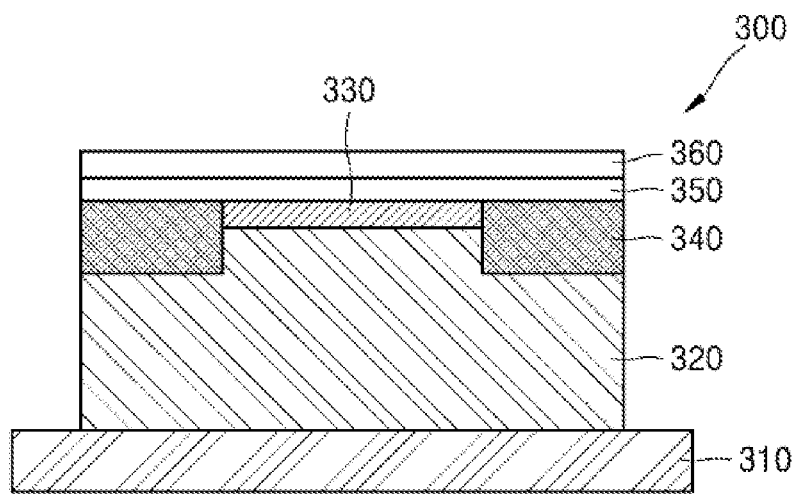
FIGS. 7 to 11 illustrate micro light emitting devices according to example embodiments.

FIG. 7 illustrates a micro light emitting device according to another example embodiment.

A micro light emitting device 300 may include a substrate 310, a first-type semiconductor layer 320 provided on the substrate 310, the superlattice layer 330 provided on the first-type semiconductor layer 320, a current blocking layer 340, an active layer 350 provided between the superlattice layer 330 and the current blocking layer 340, and a second-type semiconductor layer 360 provided on the active layer 350.

The current blocking layer 340 may be provided extending from a side portion of the superlattice layer 330 to a partial side portion of the first-type semiconductor layer 320. As the constituent elements of FIG. 7 are substantially the same as those descried with reference to FIG. 1, detailed descriptions thereof are omitted.

Figure 8:
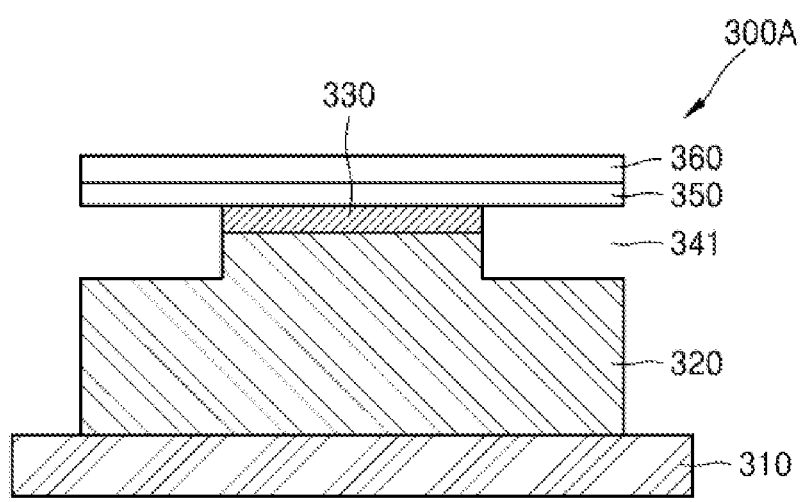

FIG. 8 illustrates a modified example of the micro light emitting device 300 of FIG. 7.

A micro light emitting device 300A may include a current blocking layer 341. A current blocking layer 341 may include an air layer. The current blocking layer 341 may be provided extending from a side portion of the superlattice layer 330 to the partial side portion of the first-type semiconductor layer 320.

Figure 9:
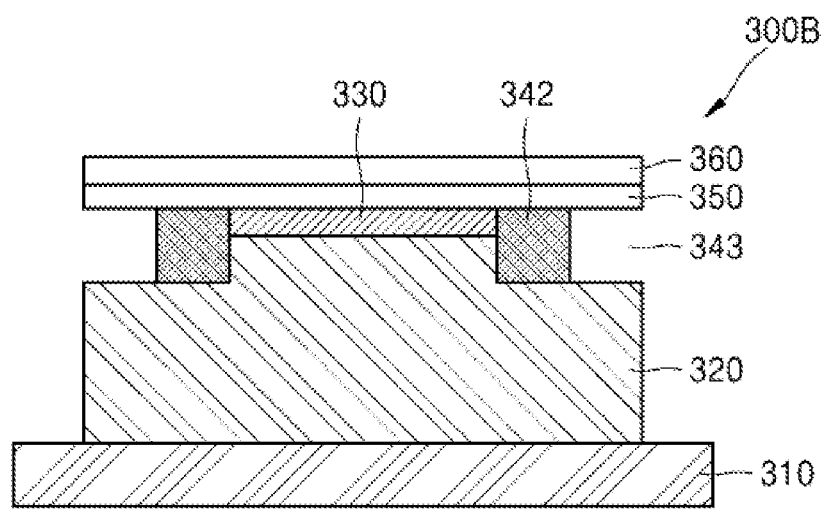

FIG. 9 illustrates another modified example of the micro light emitting device 300 of FIG. 7.

A micro light emitting device 300B may include a current blocking layer. The current blocking layer may include a porous layer 342 provided in contact with a side portion of the superlattice layer 330 and the partial side portion of the first-type semiconductor layer 320, and an air layer 343 provided a side portion of the porous layer 342.

Figure 10:
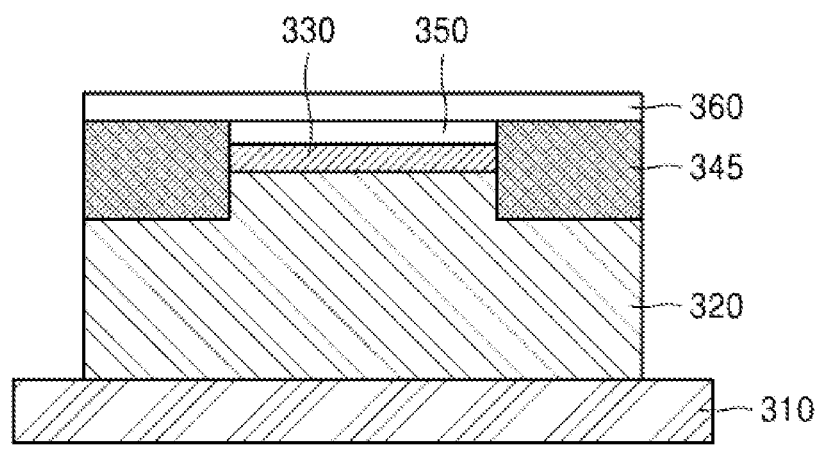

In the micro light emitting device of FIG. 10, a current blocking layer 345 may be provided in contact with the side portion of the superlattice layer 330, a side portion of the active layer 350, and the partial side portion of the first-type semiconductor layer 320.

Figure 11:
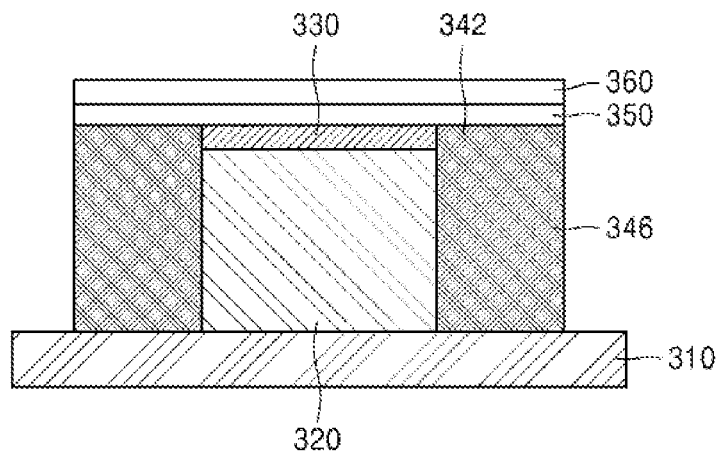

In the micro light emitting device of FIG. 11, a current blocking layer 346 may be provided extending from the side portion of the superlattice layer 330 to a bottom of the first-type semiconductor layer 320.

Figure 12:
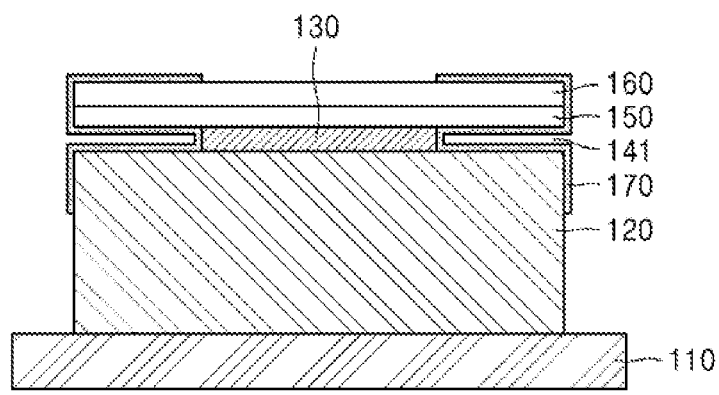
FIG. 12 illustrates an example in which the micro light emitting device of FIG. 2 is further provided with a protection layer according to an example embodiment.
Figure 13:
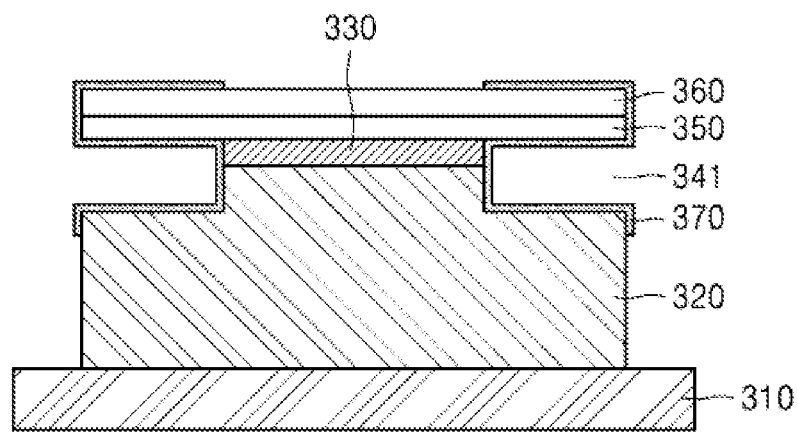
FIG. 13 illustrates an example in which the micro light emitting device of FIG. 8 is further provided with a protection layer according to an example embodiment.
Figure 14:
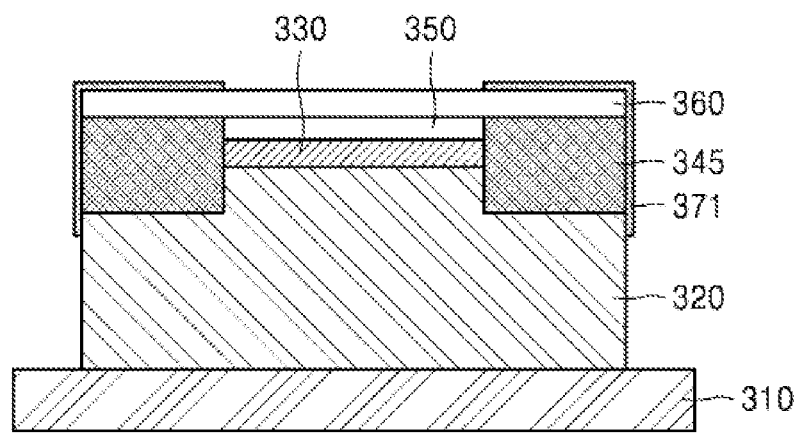
FIG. 14 illustrates an example in which the micro light emitting device of FIG. 10 is further provided with a protection layer according to an example embodiment.

FIGS. 12 to 14 illustrate examples in which the above-described embodiments are further provided with a protection layer 170.

Referring to FIG. 12, the protection layer 170 may be further provided on an exposed surface of the current blocking layer 141 of the micro light emitting device 100A of FIG. 2. The protection layer 170 may be provided on, for example, the active layer 150 and the second-type semiconductor layer 160, including the exposed surface of the current blocking layer 141. The location range of the protection layer 170 may be variously changed, including the current blocking layer 141. The protection layer 170 may be formed through, for example, an atomic layer deposition (ALD) process. The current blocking layer 141 may primarily restrict a non-emission combination, and the protection layer 170 may additionally restrict a possibility of a non-emission combination. The protection layer 170 may include, for example, $SiO_2$, SiN, $Al_2O_3$, $TiO_2$, and the like.

Referring to FIG. 13, including an exposed surface of the current blocking layer 341 of the micro light emitting device of FIG. 8, a protection layer 370 may be provided on side walls of the active layer 350, the second-type semiconductor layer 360, and first-type semiconductor layer 320.

Referring to FIG. 14, a protection layer 371 may be provided on a sidewall of the current blocking layer 345 of the micro light emitting device of FIG. 10 and a sidewall of the second-type semiconductor layer 360.

Figure 15:
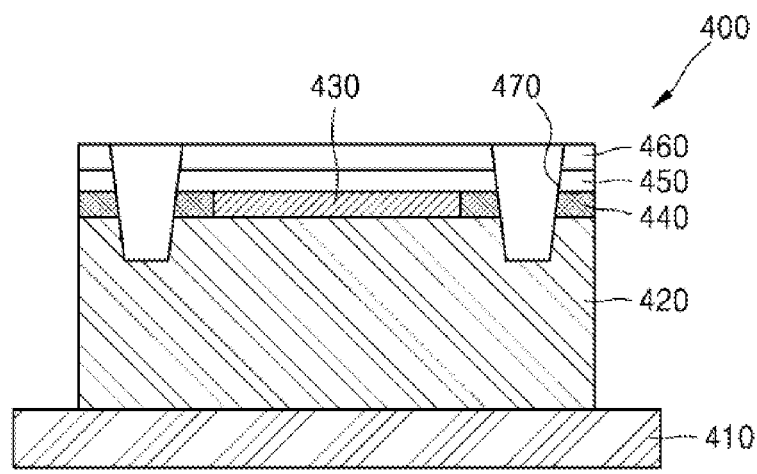
FIG. 15 is a cross-sectional view of a micro light emitting device according to another example embodiment.

FIG. 15 illustrates a micro light emitting device according to another example embodiment.

A micro light emitting device 400 may include a substrate 410, a first-type semiconductor layer 420 provided on the substrate 410, a superlattice layer 430 provided on the first-type semiconductor layer 420, a current blocking layer 440 provided on a sidewall of the superlattice layer 430, an active layer 450 provided on the superlattice layer 430 and the current blocking layer 440, and a second-type semiconductor layer 460 provided on the active layer 450.

The micro light emitting device 400 may have a horizontal electrode structure. A via hole 470 may be provided to penetrate from the second-type semiconductor layer 460 to the first-type semiconductor layer 420. The current blocking layer 440 may be provided at the circumference of the via hole 470 in the superlattice layer 430. The resistance of a surface damaged due to etching to form the via hole 470 may be relatively lowered, and to prevent a current from being induced toward a positon where resistance is low, the current blocking layer 440 may be provided at the circumference of the via hole 470.

The current blocking layer 440 may include a porous layer or an air layer, or may have a structure in which a porous layer and an air layer are combined with each other.

Figure 16:
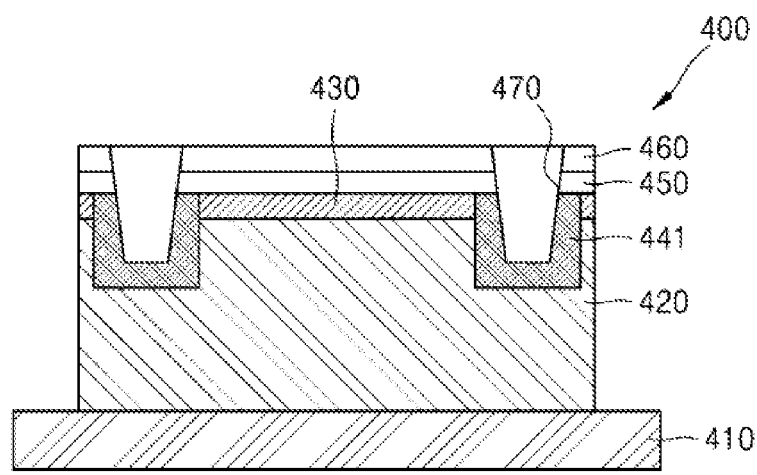
FIG. 16 illustrates a modified example of the micro light emitting device of FIG. 15 according to an example embodiment.

FIG. 16 illustrates an example in which a current blocking layer is modified in the micro light emitting device 400 of FIG. 15.

A current blocking layer 441 may be provided at the circumference of the via hole 470 in the superlattice layer 430 and at the circumference of the via hole 470 in the first-type semiconductor layer 420.

A micro light emitting device according to an example embodiment may include a current blocking layer so that, when the size of the micro light emitting device is reduced to a micro level, a current may be prevented from flowing toward a surface damaged due to etching, and the current may be induced to be concentrated on a central area of an active layer, thereby improving the emission efficiency. The current blocking layer is an area having a relatively higher contact resistance than the other area except the area or having a Schottky contact, and thus current injection may be intensively performed in the central area of the micro light emitting device.

According to an example embodiment, the current blocking layer of the disclosure may be applied to a micro LED, a nano rod type emission device having a large aspect ratio, a flake type emission device, and the like.

Figure 17:
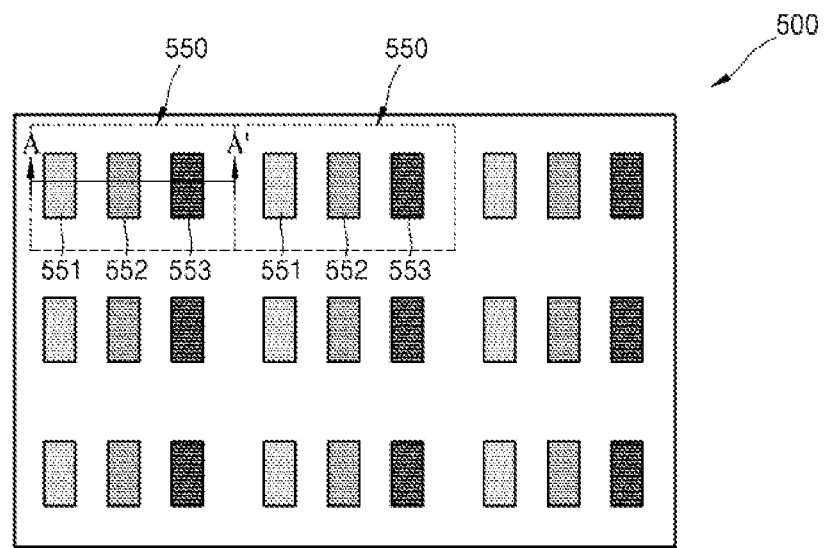
FIG. 17 is a plan view of a display apparatus according to an example embodiment.

FIG. 17 is a plan view of a micro light emitting device of a display apparatus 500 according to an example embodiment.

Referring to FIG. 17, the display apparatus 500 may include a plurality of pixels 550. The pixels 550 may be arranged in a two-dimensional matrix form. The pixels 550 may include a plurality of subpixels.

The pixels 550 may represent a basic unit indicating a color in the display apparatus 500. For example, one of the pixels 550 may include a first color light, a second color light, and a third color light, and a color may be displayed by the first to third color lights. For example, the first color light may include red light, the second color light may include green light, and the third color light may include blue light. However, the color light is not limited thereto. The pixels 550 may include a plurality of subpixels emitting each color light. For example, the pixels 550 may include a first subpixel 551 emitting the first color light, a second subpixel 552 emitting the second color light, and a third subpixel 553 emitting the third color light. The first subpixel 551, the second subpixel 552, and the third subpixel 553 each may be electrically independently driven.

Figure 18:
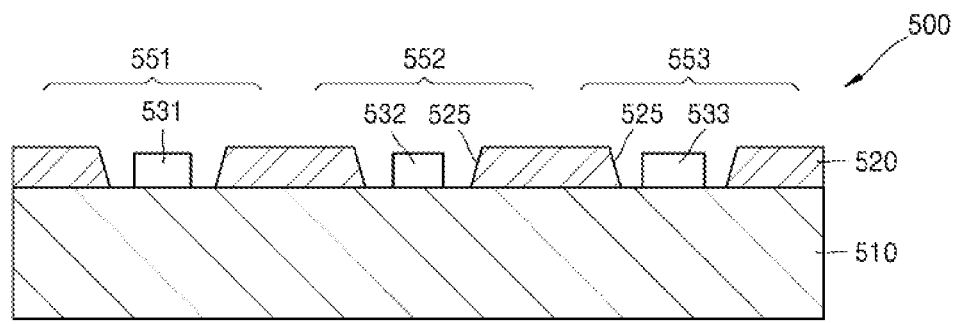
FIG. 18 is a cross-sectional view taken along line A-A of FIG. 17.

FIG. 18 is a cross-sectional view taken along line A-A of FIG. 17. FIG. 18 illustrates one subpixel of a display apparatus 500 according to an embodiment.

Referring to FIG. 18, the display apparatus 500 may include a driving circuit substrate 510 and at least one micro light emitting device connected to the driving circuit substrate 510. The at least one micro light emitting device may include, for example, a first micro light emitting device 531, a second micro light emitting device 532, and a third micro light emitting device 533. The micro light emitting device described with reference to FIGS. 1 to 16 may be used as the first, second, and third micro light emitting devices 531, 532, and 533.

The driving circuit substrate 510 may include at least one transistor and at least one capacitor that are capable of driving the first, second, and third micro light emitting devices 531, 532, and 533. The driving circuit substrate 510 may include, for example, a switch transistor, a driving transistor, and a capacitor. However, the driving circuit substrate 510 is not limited thereto, but may include one transistor and one capacitor. The driving circuit substrate 510 may be configured by, for example, a CMOS backplane. However, the driving circuit substrate 510 is not limited thereto.

The driving circuit substrate 510 may be provided with a layer 520 having a groove 525. The layer 520 may include, for example, a transfer mold or an insulating layer. The first, second, and third micro light emitting devices 531, 532, and 533 each may be provided in the groove 525. While an example in which the first, second, and third micro light emitting devices 531, 532, and 533 are provided in a structure having a groove is illustrated, the first, second, and third micro light emitting devices 531, 532, and 533 may be provided in the driving circuit substrate 510 without a groove, and an electrode structure according thereto may be variously implemented. When the layer 520 is a transfer mold, the first, second, and third micro light emitting devices 531, 532, and 533 may be transferred to the layer 520 combined to the driving circuit substrate 510 to be electrically combined with each other. Alternatively, when the layer 520 is an insulating layer, the first, second, and third micro light emitting devices 531, 532, and 533 may be transferred to, for example, the driving circuit substrate 510, and the layer 520 may be coated thereon.

In the example embodiment, the first, second, and third micro light emitting devices 531, 532, and 533 may irradiate light of a different color for each subpixel. In this case, a color filter for filtering color light from the micro light emitting device may be further provided. For example, the first micro light emitting device 531 may emit first color light, the second micro light emitting device 532 may emit second color light, and the third micro light emitting device 533 may emit third color light. For example, the first color light may be blue light, the second color light may be green light, and the third color light may be red light. As such, a plurality of micro light emitting devices may emit different color light for the respective subpixels, thereby displaying an image. The display apparatus 500 of the present embodiment may be applied to LED TVs, digital signages, mobile display apparatuses, wearable display apparatuses, virtual reality apparatuses, or augmented reality apparatuses, and the like.

The first, second, and third micro light emitting devices 531, 532, and 533 may irradiate one color light.

Figure 19:
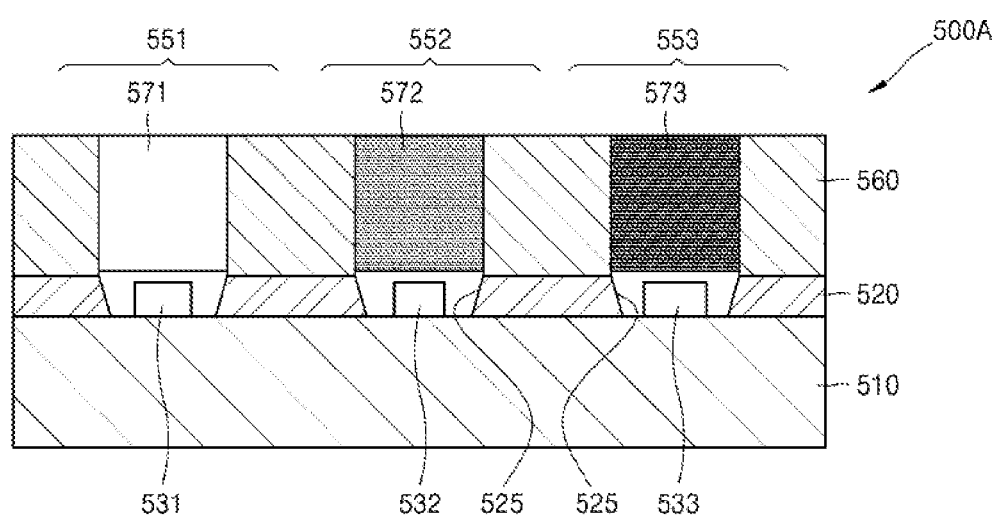
FIG. 19 is a cross-sectional view of a display apparatus according to another example embodiment.

FIG. 19 illustrates an example in which a micro light emitting device irradiate a color light according to an example embodiment.

FIG. 19 is a cross-sectional view taken along line A-A of FIG. 17. According to an example embodiment, a display apparatus 500A may include the first subpixel 551, the second subpixel 552, and the third subpixel 553. As constituent elements having the same reference numerals as those of FIG. 18 have substantially the same functions and configurations as those of FIG. 18, detailed descriptions thereof are omitted.

The display apparatus 500A may further include, for example, a partition wall 560 arranged apart by a certain distance from the layer 520 and a color conversion layer between the partition wall 560 and the partition wall 560. The color conversion layer may convert the color of light emitted from the first, second, and third micro light emitting devices 531, 532, and 533. The first, second, and third micro light emitting devices 531, 532, and 533 may emit first color light, for example, blue light. However, this is merely exemplary, and the first, second, and third micro light emitting devices 531, 532, and 533 may emit light of a different wavelength to excite the color conversion layer.

The color conversion layer may include a first color conversion layer 571 that converts light from the first micro light emitting device 531 to first color light, a second color conversion layer 572 that converts light from the second micro light emitting device 532 to second color light, and a third color conversion layer 573 that converts light from the third micro light emitting device 533 to third color light. The second color light may be, for example, green light, and the third color light may be, for example, red light.

The first color conversion layer 571 may include, for example, resin that transmits the light from the first micro light emitting device 531. The second color conversion layer 572 may emit green light by the blue light emitted from the second micro light emitting device 532. The second color conversion layer 572 may include quantum dots (QDs) having a certain size that is excited by blue light to emit green light. Each QD may have a core-shell structure having a core part and a shell part, and may also have a particle structure without a shell. The core-shell structure may have a single-shell or a multi-shell. The multi-shell may be, for example, a double-shell.

Each QD may include, for example, at least one of group II-VI semiconductor, group III-V semiconductor, group IV-VI semiconductor, group IV semiconductor, or a graphene quantum dot. A QD may include, for example, at least one of Cd, Se, Zn, S, or InP, but embodiments are not limited thereto. Each QD may have a diameter of tens of nanometers (nm) or less, for example, about 10 nm or less.

Alternatively, the second color conversion layer 572 may include phosphor that emits green light by being excited by the blue light emitted from the second micro light emitting device 532.

The third color conversion layer 573 may convert and emit the blue light emitted from the third micro light emitting device 533 to red light. The third color conversion layer 573 may include QDs having a certain size that emits red light by being excited by the blue light. Alternatively, the third color conversion layer 573 may include phosphor that emits red light by being excited by the blue light emitted from the third micro light emitting device 533.

Figure 20:
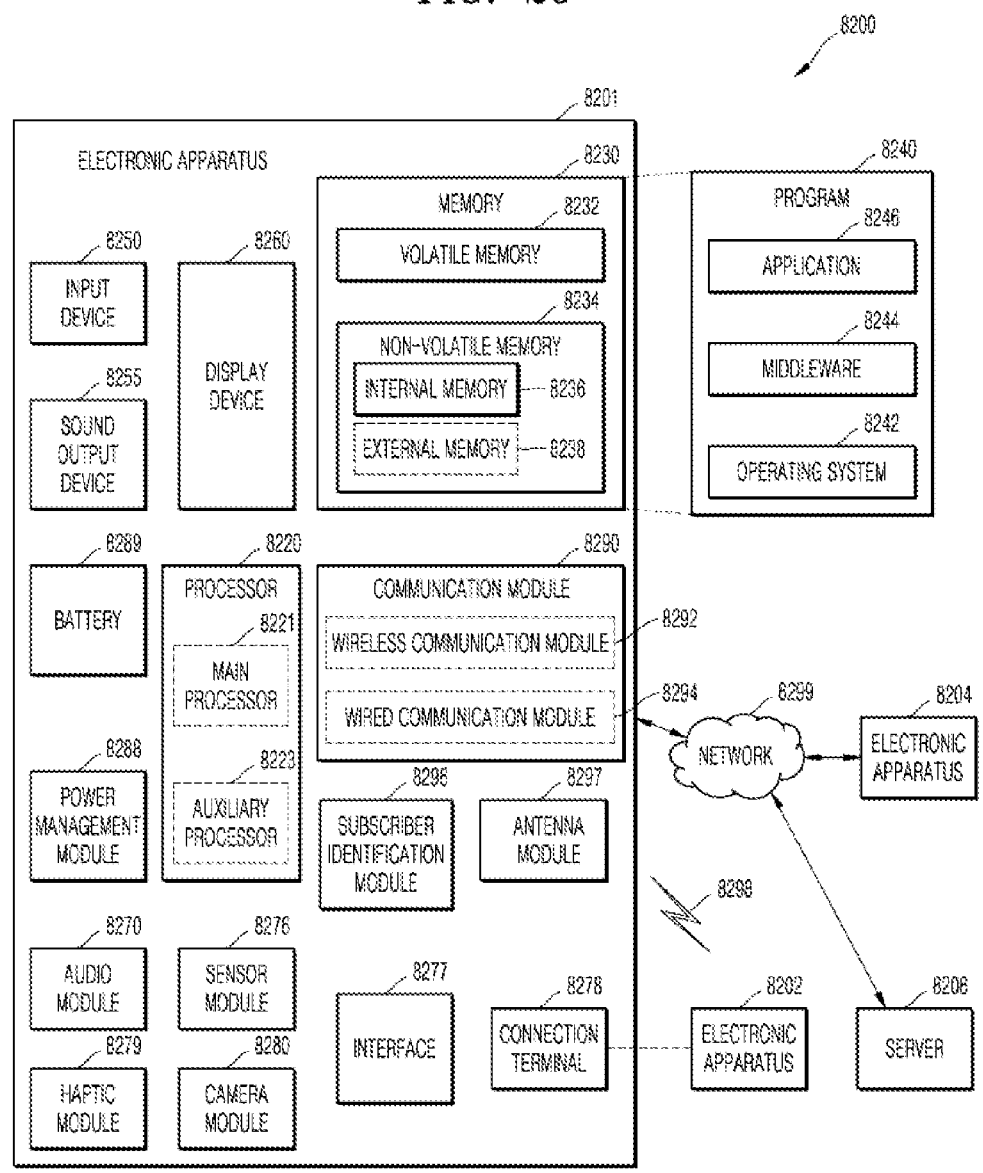
FIG. 20 is a schematic block diagram of an electronic apparatus according to an example embodiment.

FIG. 20 is a block diagram of an electronic apparatus including a display apparatus according to an example embodiment.

Referring to FIG. 20, an electronic apparatus 8201 may be provided in a network environment 8200. In the network environment 8200, the electronic apparatus 8201 may communicate with an electronic apparatus 8202 via a first network 8298, e.g., a short-range wireless communication, or communicate with an electronic apparatus 8204 or a server 8208 via a second network 8299, e.g., a remote wireless communication. The electronic apparatus 8201 may communicate with the electronic apparatus 8204 via the server 8208. The electronic apparatus 8201 may include the processor 8220, a memory 8230, an input device 8250, a sound output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and an antenna module 8297. In the electronic apparatus 8201, at least one of constituent elements, e.g., the display device 8260 or the camera module 8280, may be omitted or other constituent element may be added. Some of the constituent elements may be implemented by one integrated circuit. For example, the sensor module 8276, e.g., a fingerprint sensor, an iris sensor, or an illuminance sensor, may be implemented by being embedded in the display device 8260, e.g., a display, and the like.

The processor 8220 may control one or a plurality of other constituent elements, for example, hardware or software constituent element, and the like of the electronic apparatus

8201 connected to the processor 8220 by executing software such as a program 8240, and the like, and perform various pieces of data processing or operations. The processor 8220 may load instructions and/or data received from other constituent elements, for example, the sensor module 8276 or the communication module 8290, on a volatile memory 8232, process the instructions and/or data stored in the volatile memory 8232, and store result data in a non-volatile memory 8234. The non-volatile memory 8234 may include an internal memory 8236 and an external memory 8238 accessible through the non-volatile memory 8234. The processor 8220 may include a main processor 8221, for example, a central processing unit, an application processor, and the like, and an auxiliary processor 8223, for example, a graphics processing unit, an image signal processor, a sensor hub processor, a communication processor, and the like, which may be operated independently or altogether. The auxiliary processor 8223 may be configured to use less power than the main processor 8221, or to be specified to a designated function.

The auxiliary processor 8223 may control functions and/or states related to some constituent elements of the electronic apparatus 8201, for example, the display device 8260, the sensor module 8276, the communication module 8290, and the like, instead of the main processor 8221 when the main processor 8221 is in an inactive state, for example, a sleep state, or with the main processor 8221 when the main processor 8221 is in an active state, for example, an application execution state. The auxiliary processor 8223, for example, an image signal processor, a communication processor, and the like, may be implemented as a part of other functionally related constituent elements, for example, the camera module 8280, the communication module 8290, and the like.

The memory 8230 may store various pieces of data used by the constituent elements of the electronic apparatus 8201, for example, the processor 8220, the sensor module 8276, and the like. The data may include, for example, software such as the program 8240 and the like, and input data and/or output data regarding instructions related thereto. The memory 8230 may include the volatile memory 8232 and/or the non-volatile memory 8234.

The program 8240 may be stored as software in the memory 8230 and may include, for example, an operating system 8242, a middleware 8244, and/or an application 8246.

The input device 8250 may receive instructions and/or data used for the constituent elements of the electronic apparatus 8201, for example, the processor 8220, and the like, from the outside of the electronic apparatus 8201, for example, from a user, and the like. The input device 8250 may include, for example, a remote controller, a microphone, a mouse, a keyboard, and/or a digital pen such as a stylus pen, and the like.

The sound output device 8255 may output a sound signal to the outside of the electronic apparatus 8201. The sound output device 8255 may include, for example, a speaker or a receiver. A speaker may be used for a general purpose such as multimedia reproduction or recording reproduction, and a receiver may be used for receiving an incoming call. The receiver may be implemented independently separated from or as a part of the speaker.

The display device 8260 may visually provide information to the outside of the electronic apparatus 8201 The display device 8260 may include, for example, a display, a hologram device, or a projector, and a control circuit for control any of the devices. The display device 8260 may include a micro light emitting device described with reference to FIGS. 1 to 17. The display device 8260 may include a touch circuitry configured to sense a touch, and/or a sensor circuit, for example, a pressure sensor, and the like, configured to measure the strength of a force generated by the touch.

The audio module 8270 may convert sound to an electrical signal or reversely an electrical signal to sound. The audio module 8270 may obtain sound through the input device 8250 or output sound through the sound output device 8255 and/or an external electronic apparatus, for example, the electronic apparatus 8201 such as a speaker and/or a headphone, directly or wirelessly connected to the electronic apparatus 8201.

The sensor module 8276 may detect an operating state, for example, power or temperature, and the like, of the electronic apparatus 8201, or an external environment state, for example, a user state, and the like, and generate an electrical signal and/or a data value corresponding to a detected state. The sensor module 8276 may include, for example, a gesture sensor, a gyro sensor, a barometric pressure sensor, a magnetic sensor, an acceleration sensor, a grip sensor, a proximity sensor, a color sensor, an infrared (IR) sensor, a biological sensor, a temperature sensor, a humidity sensor, and/or an illuminance sensor.

The interface 8277 may support one or more designated protocols to be used for the electronic apparatus 8201 to directly or wirelessly connect to the external electronic apparatus, for example, the electronic apparatus 8202. The interface 8277 may include, for example, a high definition multimedia interface (HDMI), a universal serial bus (USB) interface, an SD card interface, and/or an audio interface.

A connection terminal 8278 may include a connector through which the electronic apparatus 8201 is physically connected to the external electronic apparatus, for example, the electronic apparatus 8202. The connection terminal 8278 may include, for example, an HDMI connector, a USB connector, an SD card connector, and/or an audio connector, for example, a headphone connector, and the like.

The haptic module 8279 may convert an electrical signal to a mechanical stimulus, for example, a vibration, a movement, and the like, which may be recognized by a user through a tactile sense or a sense of movement, or to an electrical stimulus. The haptic module 8279 may include, for example, a motor, a piezoelectric device, and/or an electrical stimulation device.

The camera module 8280 may photograph a still image and a video. The camera module 8280 may include a lens assembly including one or more lenses, image sensors, image signal processors, and/or flashes. The lens assembly included in the camera model 8280 may collect light emitted from a subject that is a target of image photography.

The power management module 8288 may manage electric power supplied to the electronic apparatus 8201. The power management module 8288 may be implemented as a part of a power management integrated circuit (PMIC).

The battery 8289 may supply electric power to the constituent elements of the electronic apparatus 8201. The battery 8289 may include, for example, non-rechargeable primary cells, rechargeable secondary cells, and/or fuel cells.

The communication module 8290 may establish a direct (wired) communication channel or a wireless communication channel between the electronic apparatus 8201 and the other electronic apparatus, for example, the electronic apparatus 8202, the electronic apparatus 8204, or the server 8208, and support a communication through the established communication channel. The communication module 8290 may include one or more communication processors that are independently operated of the processor 8220, for example, an application processor, and the like, and support a direct communication and/or a wireless communication. The communication module 8290 may include a wireless communication module 8292, for example, a cellular communication module, a short-range wireless communication module, or a global navigation satellite system (GNSS) communication module, and/or a wired communication module 8294, for example, a LAN communication module, or a power line communication module. Any corresponding communication module of the communication modules may communicate with other electronic apparatus through the first network 8298, for example, a short-range communication network such as Bluetooth, WiFi direct, or infrared data association (IrDA), or the second network 8299, for example, a long-range communication network such as a cellular network, the Internet, or a computer network such as LAN or WAN. These various types of communication modules may be implemented by being integrated into one constituent element, for example, a single chip, or as a plurality of separate constituent elements, for example, a plurality of chips. The wireless communication module 8292 may identify and approve the electronic apparatus 8201 in a communication network such as the first network 8298 and/or the second network 8299 by using user information, for example, an international mobile subscriber identity (IMSI) stored in the subscriber identification module 8296.

The antenna module 8297 may transmit a signal or power to the outside, for example, other electronic apparatuses, and the like, or receive the same from the outside. An antenna may include a radiation body formed in a conductive pattern formed on a substrate, for example, a printed circuit board (PCB), and the like. The antenna module 8297 may include one or a plurality of antennas. When a plurality of antennas are included, an antenna suitable for a communication method used in a communication network such as the first network 8298 and/or the second network 8299 may be selected by the communication module 8290 from among a plurality of antennas. A signal and/or power may be transmitted or received between the communication module 8290 and other electronic apparatus through the selected antenna. Other parts than the antenna, for example, RFIC, and the like, may be included as a part of the antenna module 8297.

Some of the constituent elements may be mutually connected to each other through a communication method between peripheral devices, for example, a bus, a general-purpose input and output (GPIO), a serial peripheral interface (SPI), or a mobile industry processor interface (MIPI), and exchange signals, for example, instructions or data therebetween.

The instructions or data may be transmitted or receive between the electronic apparatus 8201 and the electronic apparatus 8204 at the outside via the server 8208 connected to the second network 8299. The electronic apparatuses 8202 and 8204 may be apparatuses that are the same as or different from the electronic apparatus 8201. All or some of the operations performed in the electronic apparatus 8201 may be performed in one or more apparatuses of other electronic apparatuses such as the electronic apparatuses 8202 and 8204 or the server 8208. For example, when the electronic apparatus 8201 is supposed to perform a function or a service, the electronic apparatus 8201 may request one or more other electronic apparatuses to perform some or the whole of the function or the service, rather than performing the function or the service. One or more other electronic apparatus having received the request may perform an additional function or service related to the request, and transmit a result of the performance to the electronic apparatus 8201. To this end, for example, cloud computing, distributed computing, or client-server computing technologies may be used.

Figure 21:
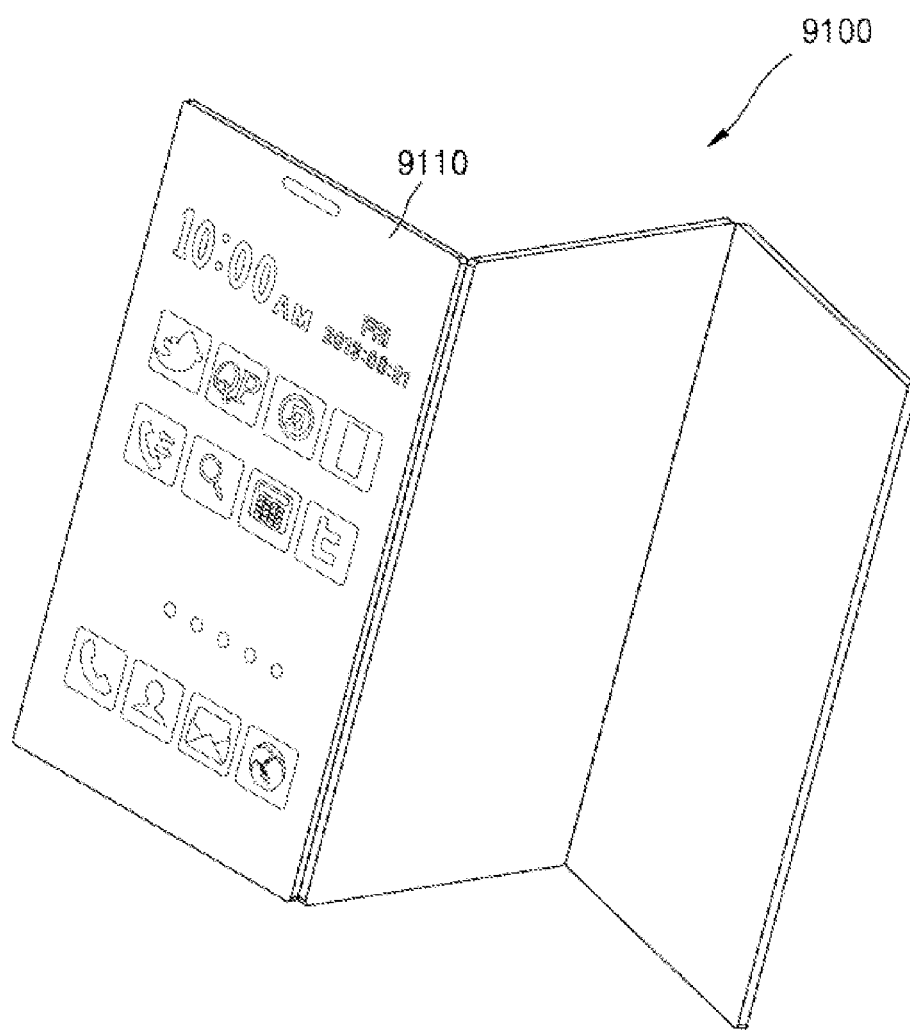
FIG. 21 illustrates an example in which a display apparatus according to an example embodiment is applied to a mobile device.

FIG. 21 illustrates an electronic apparatus being applied to a mobile device 9100 according to an example embodiment. The mobile device 9100 may include a display apparatus 9110 according to an embodiment. The display apparatus 9110 may include a micro light emitting device described with reference to FIGS. 1 to 16. The display apparatus 9110 may have a foldable structure, for example, a multi folder display. Although the mobile device 9100 is illustrated to be a foldable display, the mobile device 9100 may be applied to a general flat type display.

Figure 22:
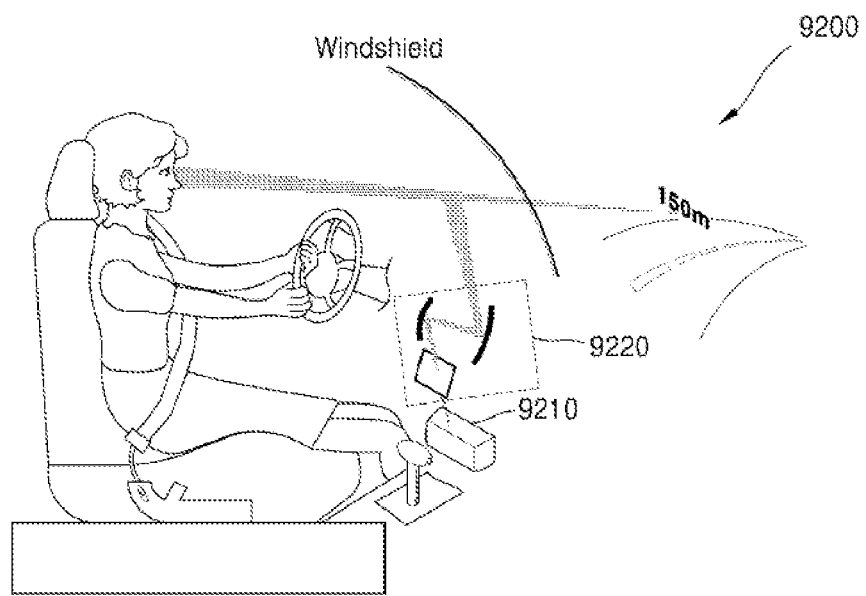
FIG. 22 illustrates an example in which a display apparatus according to an example embodiment is applied to a display apparatus for a vehicle.

FIG. 22 illustrates a display apparatus being applied to a vehicle according to an example embodiment. The display apparatus may be applied to a head-up display apparatus 9200 of the vehicle. The head-up display apparatus 9200 may include a display apparatus 9210 provided at an area of a car, and at least one or more optical path change members 9220 that may change an optical path so that a driver may see an image generated by the display apparatus 9210.

Figure 23:
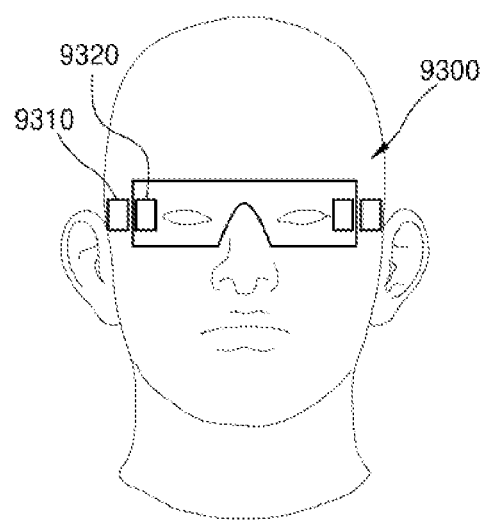
FIG. 23 illustrates an example in which a display apparatus according to an example embodiment is applied to augmented reality glasses.

FIG. 23 illustrates a display apparatus being applied to augmented reality glasses or virtual reality glasses according to an example embodiment. A pair of augmented reality glasses 9300 may include a projection system 9310 for forming an image and at least one component 9320 for guiding an image from the projection system 9310 to proceed toward a user's eye. The projection system 9310 may include the micro light emitting device described with reference to FIGS. 1 to 16.

Figure 24:
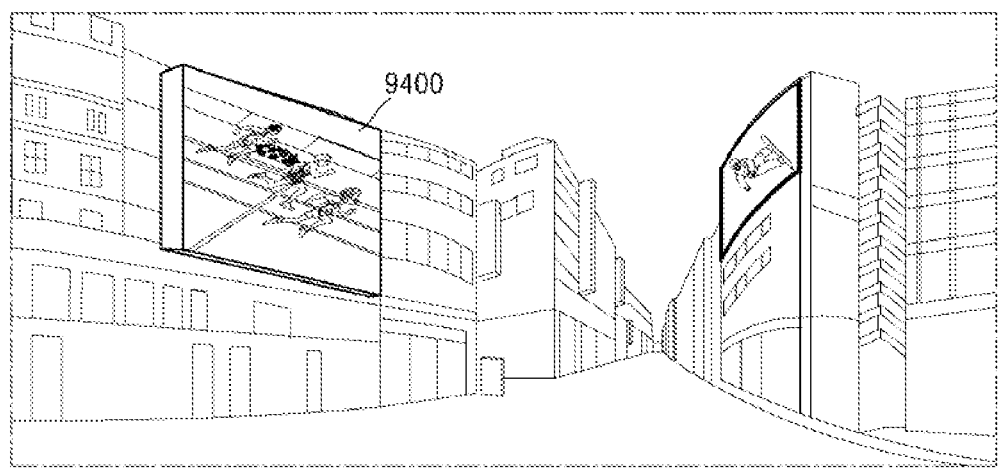
FIG. 24 illustrates an example in which a display apparatus according to an example embodiment is applied to a signage.

FIG. 24 illustrates a display apparatus being applied to a large signage according to an example embodiment. A signage 9400 may be used for outdoor advertisement using a digital information display, and may control advertisement contents, and the like through a communication network. The signage 9400 may be implemented through, for example, the electronic apparatus described with reference to FIG. 20.

Figure 25:
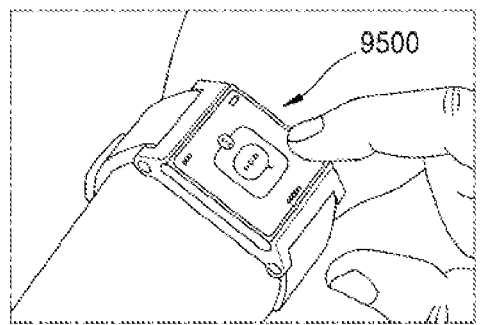
FIG. 25 illustrates an example in which a display apparatus according to an example embodiment is applied to a wearable display.

FIG. 25 illustrates a display apparatus being applied to a wearable display according to an example embodiment. A wearable display 9500 may include the micro light emitting device described with reference to FIGS. 1 to 16, and may be implemented through the electronic apparatus described with reference to FIG. 20.

The display apparatus according to an embodiment may be applied to various products such as a rollable TV, a stretchable display, and the like.

As a micro light emitting device according to an embodiment includes a current blocking layer capable of controlling current injection in a lower portion of an active layer, non-emission combination occurring in a side wall due to a side wall etching damage of an emission device is reduced so that emission efficiency may be improved.

Descriptions of features or aspects within each embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:
1. A micro light emitting device comprising:
a substrate;

a first-type semiconductor layer provided on the substrate;
a superlattice layer provided on the first-type semiconductor layer;
a current blocking layer provided at a side portion of the superlattice layer;
an active layer directly provided on the superlattice layer and the current blocking layer;
a second-type semiconductor layer provided on the active layer,
wherein the superlattice layer has a first layer and a second layer that are alternatively stacked, and the superlattice layer has a bandgap greater than the active layer.

2. The micro light emitting device of claim 1, wherein the current blocking layer comprises a porous layer or an air layer.

3. The micro light emitting device of claim 2, wherein the porous layer comprises a gallium nitride.

4. The micro light emitting device of claim 1, wherein the current blocking layer comprises:
a porous layer that contacts the side portion of the superlattice layer; and
an air layer provided on a side portion of the porous layer.

5. The micro light emitting device of claim 1, wherein the current blocking layer extends from the side portion of the superlattice layer to a side portion of the first-type semiconductor layer or a bottom of the first-type semiconductor layer.

6. The micro light emitting device of claim 1, wherein the current blocking layer extends from the side portion of the superlattice layer to a side portion of the active layer.

7. The micro light emitting device of claim 1, further comprising a nano rod type micro light emitting device.

8. The micro light emitting device of claim 1, wherein the current blocking layer is provided extending from the side portion of the superlattice layer to a side portion of the first-type semiconductor layer or a bottom of the first-type semiconductor layer.

9. The micro light emitting device of claim 1, further comprising a protection layer provided on a side wall of the active layer, a side wall of the second-type semiconductor layer, and an exposed surface of the current blocking layer.

10. The micro light emitting device of claim 1, further comprising a via hole that extends through the second-type semiconductor layer, the active layer and the current blocking layer and into the first-type semiconductor layer.

11. The micro light emitting device of claim 10, wherein the current blocking layer is further provided along a circumference of the via hole of the first-type semiconductor layer.

12. The micro light emitting device of claim 1, wherein the micro light emitting device has a diameter of about 200 μm or less.

13. The micro light emitting device of claim 1, wherein the superlattice layer comprises InGaN layers and GaN layers that are alternately stacked.

14. A display apparatus comprising:
a driving circuit substrate; and
a plurality of micro light emitting devices arranged to be electrically connected to the driving circuit substrate,
wherein each of the plurality of micro light emitting devices comprises:
a first-type semiconductor layer,
a superlattice layer provided on the first-type semiconductor layer,
a current blocking layer provided on a side portion of the superlattice layer,
an active layer directly provided on the superlattice layer and the current blocking layer, and
a second-type semiconductor layer provided on the active layer, and
wherein the superlattice layer has a first layer and a second layer that are alternatively stacked, and the superlattice layer has a bandgap greater than the active layer.

15. The display apparatus of claim 14, wherein the current blocking layer comprises a porous layer or an air layer.

16. The display apparatus of claim 15, wherein the porous layer comprises a gallium nitride.

17. The display apparatus of claim 14, wherein the current blocking layer comprises:
a porous layer that contacts the side portion of the superlattice layer; and
an air layer provided on a side portion of the porous layer.

18. The display apparatus of claim 14, wherein the current blocking layer extends from the side portion of the superlattice layer to a side portion of the first-type semiconductor layer or a bottom of the first-type semiconductor layer.

19. The display apparatus of claim 14, wherein the current blocking layer extends from the side portion of the superlattice layer to a side portion of the active layer.

20. The display apparatus of claim 14, wherein the current blocking layer extends from the side portion of the superlattice layer to a side portion of the first-type semiconductor layer or a bottom of the first-type semiconductor layer.

21. The display apparatus of claim 14, further comprising a protection layer on a side wall of the active layer, a sidewall of the second-type semiconductor layer, and an exposed surface of the current blocking layer.

22. The display apparatus of claim 14, further comprising a via hole penetrating from the second-type semiconductor layer to the first-type semiconductor layer, wherein the current blocking layer is provided around the via hole of the superlattice layer.

23. The display apparatus of claim 14, wherein each micro light emitting device of the plurality of micro light emitting devices has a diameter of about 200 μm or less.

24. The display apparatus of claim 14, wherein the superlattice layer comprises InGaN layers and GaN layers that are alternately stacked.

25. The display apparatus of claim 14, further comprising a color conversion layer configured to change a color of light emitted from the plurality of micro light emitting devices.

26. The display apparatus of claim 14, wherein the display apparatus is applied to a micro LED TV, a digital signage, a mobile display apparatus, a wearable display apparatus, a virtual reality apparatus, or an augmented reality apparatus.

27. A micro light emitting device comprising:
a substrate;
a first semiconductor layer provided on the substrate;
a superlattice layer provided on the first semiconductor layer;
a high resistance layer surrounding at least a portion of a peripheral region the superlattice layer;
an active layer directly provided on the superlattice layer; and
a second semiconductor layer provided on the active layer,
wherein the high resistance layer has a higher resistance than the superlattice layer, and
wherein the superlattice layer has a first layer and a second layer that are alternatively stacked, and the superlattice layer has a bandgap greater than the active layer.

28. A micro light emitting device comprising:
a substrate;
a first semiconductor layer provided on the substrate;
a superlattice layer provided on a first portion of a first surface of the first semiconductor a high resistance layer provided on a second portion of the first surface of the first semiconductor layer;
an active layer directly provided on the superlattice layer; and
a second semiconductor layer provided on the active layer,
wherein the high resistance layer has a higher resistance than the superlattice layer, and
wherein the superlattice layer has a first layer and a second layer that are alternatively stacked, and the superlattice layer has a bandgap greater than the active layer.

* * * * *